(12) United States Patent
Liu

(10) Patent No.: US 11,350,535 B2
(45) Date of Patent: May 31, 2022

(54) FLOATING RUBBER FOOT FOR ELECTRONIC DEVICES

(71) Applicant: Hewlett-Packard Development Company, L.P., Spring, TX (US)

(72) Inventor: Chyun-Nan Liu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 25 days.

(21) Appl. No.: 16/608,217

(22) PCT Filed: Apr. 18, 2017

(86) PCT No.: PCT/US2017/028092
§ 371 (c)(1),
(2) Date: Oct. 25, 2019

(87) PCT Pub. No.: WO2018/194562
PCT Pub. Date: Oct. 25, 2018

(65) Prior Publication Data
US 2020/0196470 A1 Jun. 18, 2020

(51) Int. Cl.
*F16M 13/00* (2006.01)
*H05K 5/02* (2006.01)
*G06F 1/16* (2006.01)

(52) U.S. Cl.
CPC ......... *H05K 5/0234* (2013.01); *G06F 1/1656* (2013.01); *G06F 1/1616* (2013.01)

(58) Field of Classification Search
CPC . H05K 5/0234; G06F 1/1656; G06F 11/1616; G06F 1/166
See application file for complete search history.

(56) References Cited

U.S. PATENT DOCUMENTS

| | | | |
|---|---|---|---|
| 6,979,778 B2 | 12/2005 | Xiong et al. | |
| 8,941,990 B2 * | 1/2015 | Uttermann | G06F 1/166 |
| | | | 361/679.59 |
| 9,084,350 B2 * | 7/2015 | Ho | F16F 15/023 |
| 9,423,828 B2 * | 8/2016 | Sprenger | G06F 1/166 |
| 9,491,875 B2 * | 11/2016 | Deng | G06F 1/166 |
| 10,420,230 B2 * | 9/2019 | Uchiyama | H05K 5/0204 |
| 2005/0217879 A1 | 10/2005 | Xiong et al. | |
| 2011/0051339 A1 | 3/2011 | Wang et al. | |
| 2011/0102981 A1 | 5/2011 | Chen | |
| 2012/0243153 A1 | 9/2012 | Uttermann et al. | |

(Continued)

FOREIGN PATENT DOCUMENTS

| | | |
|---|---|---|
| JP | 2012156244 A | 8/2012 |
| WO | WO-2011091551 A1 | 8/2011 |

OTHER PUBLICATIONS

2" Sorbothane Hemisphere Rubber Bumper Non-Skid Feet with Adhesive 50 Durometer.

*Primary Examiner* — Amy J. Sterling
(74) *Attorney, Agent, or Firm* — HP Inc. Patent Department

(57) ABSTRACT

A floating rubber foot structure is provided herein. The floating rubber foot structure includes a floating rubber foot extending through an opening in a device case. The floating rubber foot is mounted to an inner surface of the device case at a mounting point proximate to the opening, and the floating rubber foot is disposed with a gap between the floating rubber foot and a wall of the opening in the device case.

15 Claims, 11 Drawing Sheets

(56) References Cited

U.S. PATENT DOCUMENTS

2013/0075550 A1* 3/2013 Chiu .................. G06F 1/181
                                                   248/188.9
2013/0088819 A1   4/2013 Dernier et al.

* cited by examiner

FLOATING RUBBER FOOT FOR ELECTRONIC DEVICES

BACKGROUND

Rubber feet for electronic devices are generally hemispherical or square pieces of solid rubber that are glued to indentations on the bottom of cases of electronic devices. These support systems lift electronic devices off supporting surfaces and provide friction to hold the electronic devices in place during use. However, as electronic devices become lighter and smaller, current support systems may not compensate for small deformations of the case from manufacturing variance or pressure during use. This may lead to rocking of the electronic devices during use, and to potential contact with the surfaces the devices are sitting on.

DESCRIPTION OF THE DRAWINGS

Certain examples are described in the following detailed description and in reference to the drawings, in which.

DETAILED DESCRIPTION

As electronic devices, such as notebook computers, become lighter, the normal rubber foot may not be able to absorb the clearance coming from deformation of electronic devices. This may lead to rocking motions of the device and other problems during use, such as contact with a supporting surface.

A floating rubber foot is described herein that may be more pressure sensitive than a normal rubber foot design. The floating rubber foot is supported from a mounting point within the case, for example, in a lower portion, of an electronic device. The floating rubber foot extends through openings on the bottom surface of the case. This allows the floating rubber foot to partially flex or deform up into the case, providing for more clearance or deformation than a normal rubber foot, while not occupying more space at the bottom of the case of the electronic device.

Further, as described herein the floating rubber foot may be developed for different design environments that have different weights of device and different allowances of space within the device. The floating rubber foot may use a hollow design to increase the flexibility. Accordingly, the floating type rubber foot may support more stroke or deformation for the same weight of device, for example, from keystrokes, an open display, manufacturing variations, and the like.

Figure 1:
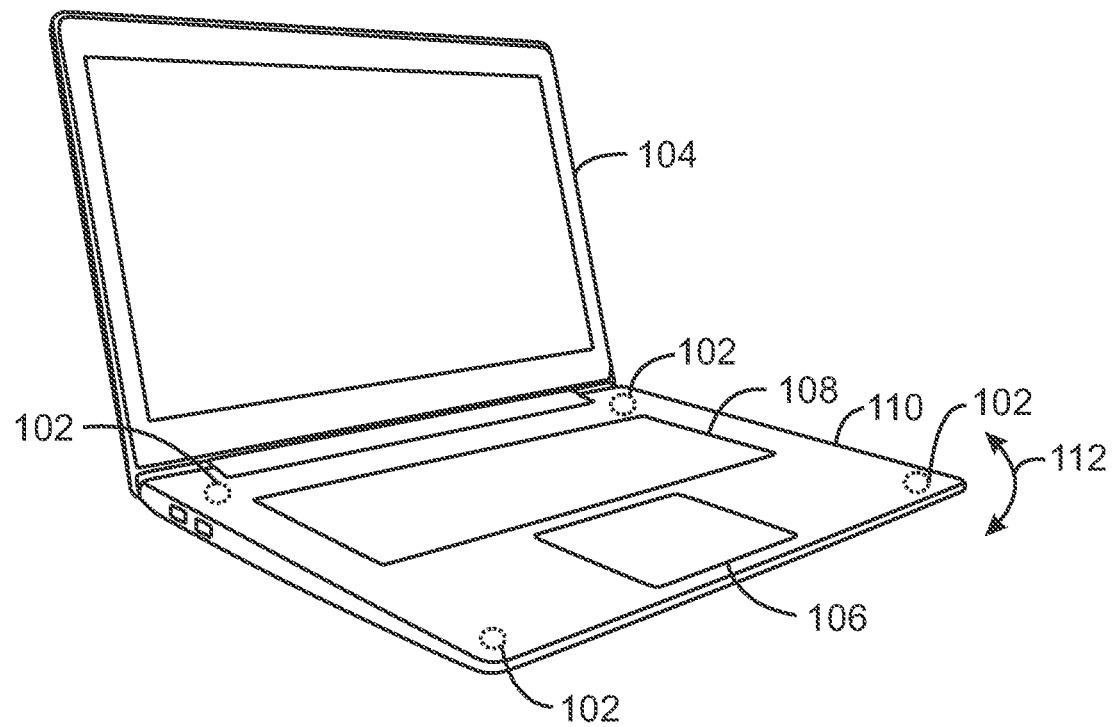
FIG. 1 is a drawing of an example of an electronic device supported by four floating rubber feet.

FIG. 1 is a drawing of an example of an electronic device 100 supported by four floating rubber feet 102. The floating rubber feet 102 provides support to the device under different conditions. In this example, the electronic device 100 is a laptop computer. When the display 104 of the laptop computer is opened, the back of the laptop computer, for example, proximate to the display 104 will have more loading than the front of the laptop computer, for example, proximate to a touchpad 106. For lighter devices, the change in balance may lead to contact with a supporting surface. Further, use of the keyboard 108 may cause deformation of the lower case 110. Both conditions may lead to a rocking motion 112 of the lower case 110.

As described herein, the floating rubber feet 102 may allow for sufficient motion of the lower case 110 to decrease the probability of contact with the supporting surface, for example, when the display 104 of the laptop computer is opened. Similarly, the floating rubber feet 102 may allow for sufficient motion of the lower case 110 to decrease the probability of the rocking motion 112 occurring during use.

The floating rubber feet 102 may be circular as shown in FIG. 1. However, any number of other shapes may be used depending on the application and device. For example, the floating rubber feet 102 may be square, linear, and the like.

Figure 2:
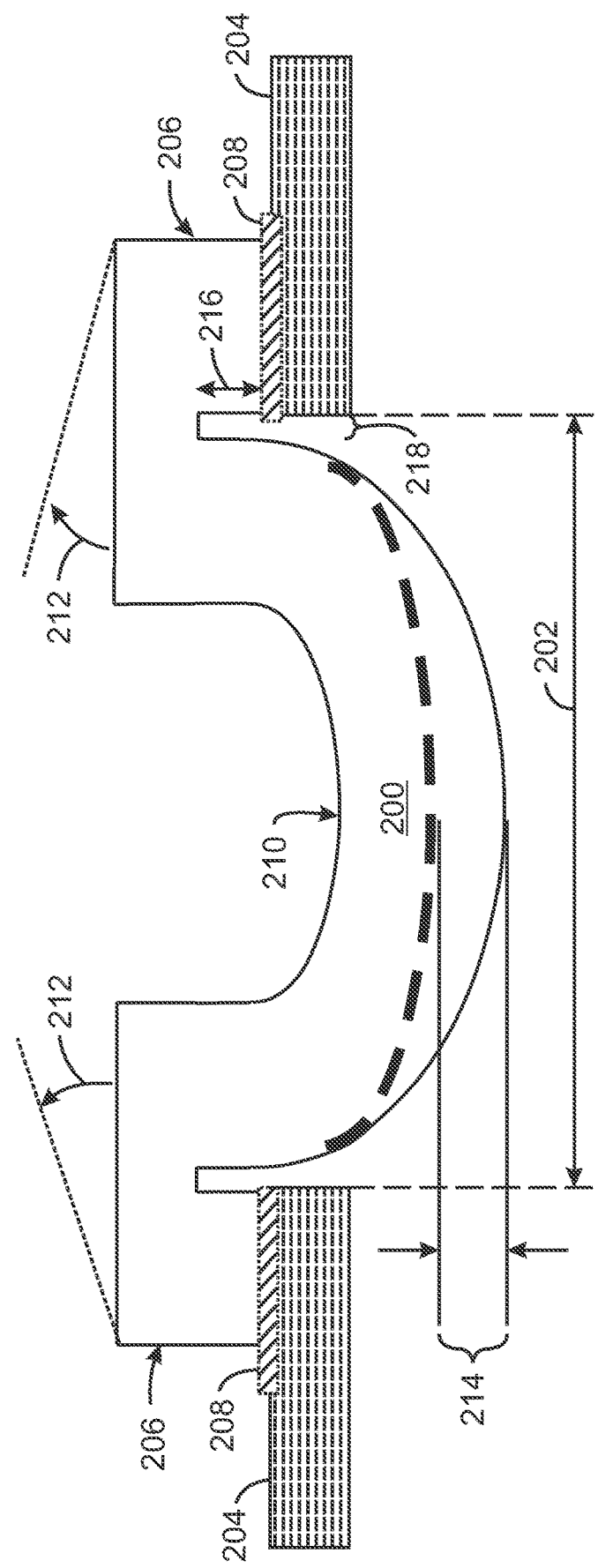
FIG. 2 is a cross-sectional view of an example of a floating rubber foot that uses a hollow foot structure.

FIG. 2 is a cross-sectional view of an example of a floating rubber foot 200 that uses a hollow foot structure. The floating rubber foot 200 protrudes from an opening 202 in a device case 204. The floating rubber foot 200 may be supported by a portion forming a pillar 206 that is mounted to the inside surface of the device case 204 proximate to the opening 202. An adhesive layer 208, such as a contact adhesive, a hot melt adhesive, or other materials, may be used to hold the floating rubber foot 200 in place.

The floating rubber foot 200, and other floating rubber foot structures described with respect to FIGS. 2 through 9, may be formed from a silicon rubber, or any number of other types of elastomeric polymers, including, for example, organic elastomeric polymers, inorganic elastomeric polymers, or organic/inorganic elastomeric polymers. The elastomeric polymers may be made from single monomers or may be copolymer made from mixtures of monomers. The selection of the elastomeric polymers may be made, for example, based on compatibility with circuitry, the materials of the device case 204, the materials used in the adhesive layer 208, and the like.

The pillar 206 allows the central portion 210 of the floating rubber foot 200 to move in an upwards motion 212 into the device case 204. This may allow for greater motion 214 of the central portion 210 then could be achieved with a foot mounted to the outside of the device case 204.

The amount of motion 214 may be controlled by a number of factors. For example, the depth 216 of the pillar 206 and the gap 218 between the central portion 210 and the pillar 206 may be used to control the stiffness of the floating rubber foot 200. The stiffness may control how much motion 214 may be achieved.

The use of a hollow structure for the central portion 210 of the floating rubber foot 200 may also be used to adjust the stiffness of the floating rubber foot 200. For example, the thickness of the floating rubber foot 200, especially in the central portion 210, may also control the stiffness, and thus, the amount of motion 214 that may be achieved.

Figure 3:
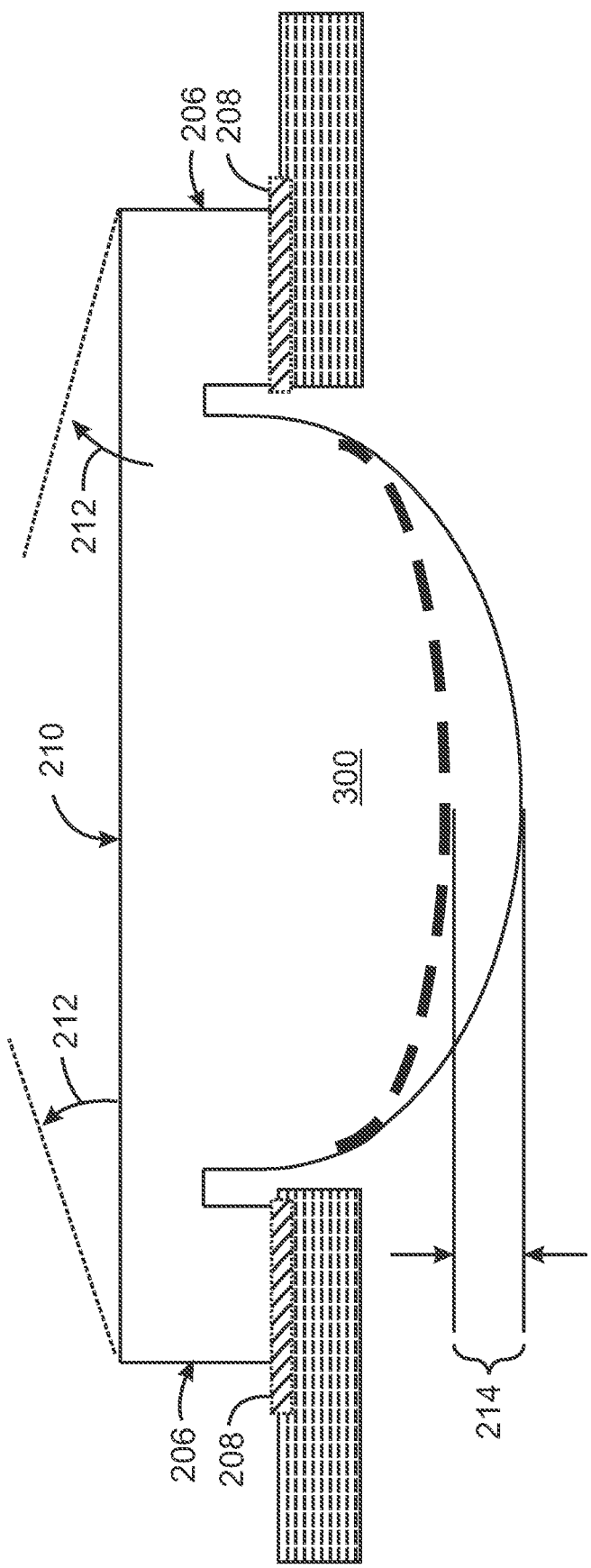
FIG. 3 is a cross-sectional view of an example of a floating rubber foot that uses a solid foot structure.

FIG. 3 is a cross-sectional view of an example of a floating rubber foot 300 that uses a solid foot structure. Like numbered items are as described with respect to FIG. 2. The floating rubber foot 300 may be solid in the center portion 210. This may be used when higher stiffness or less motion 214 is desirable. For example, a floating rubber foot 300 that uses a solid foot structure may be used with a higher weight device that has a thin profile.

Figure 4:
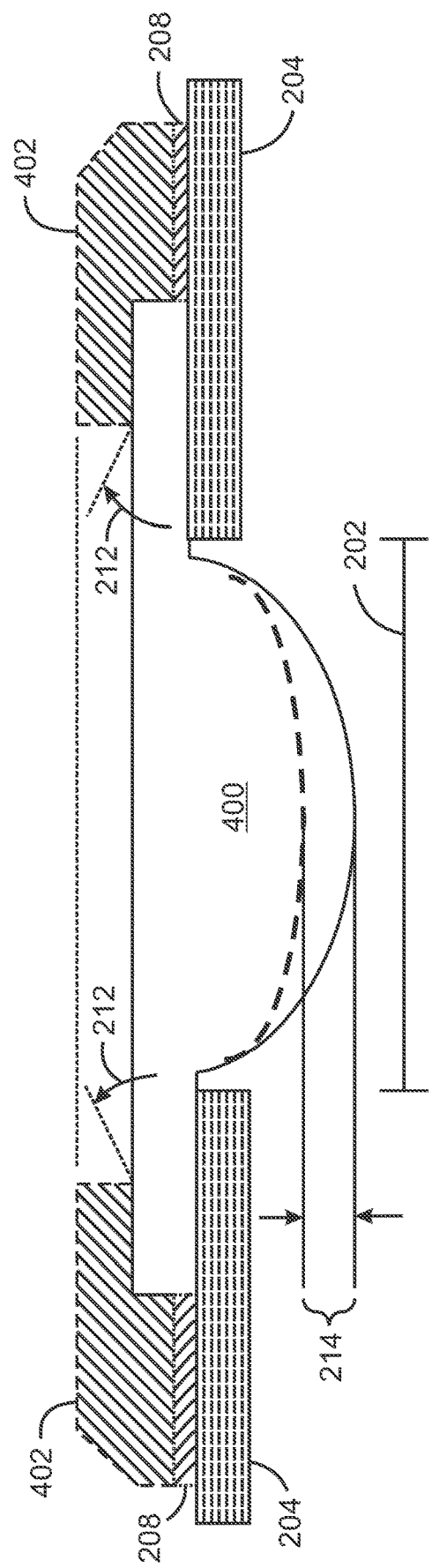
FIG. 4 is a cross-sectional view of an example of a floating rubber foot that is held in place with a plastic mounting device.

FIG. 4 is a cross-sectional view of an example of a floating rubber foot 400 that is held in place with a plastic mounting device 402. Like numbered items are as described with respect to FIG. 2. In some examples, it may be advantageous to further increase the stiffness or limit the upwards motion 212 of the floating rubber foot 400 into the interior of the case 204, while retaining sufficient motion 214 to prevent rocking or contact. This may be performed, for example, by mounting the floating rubber foot 400 on the interior surface of the case 204 using a plastic mounting device 402 that is mounted on the case 204 using an adhesive layer 208.

Figure 8:
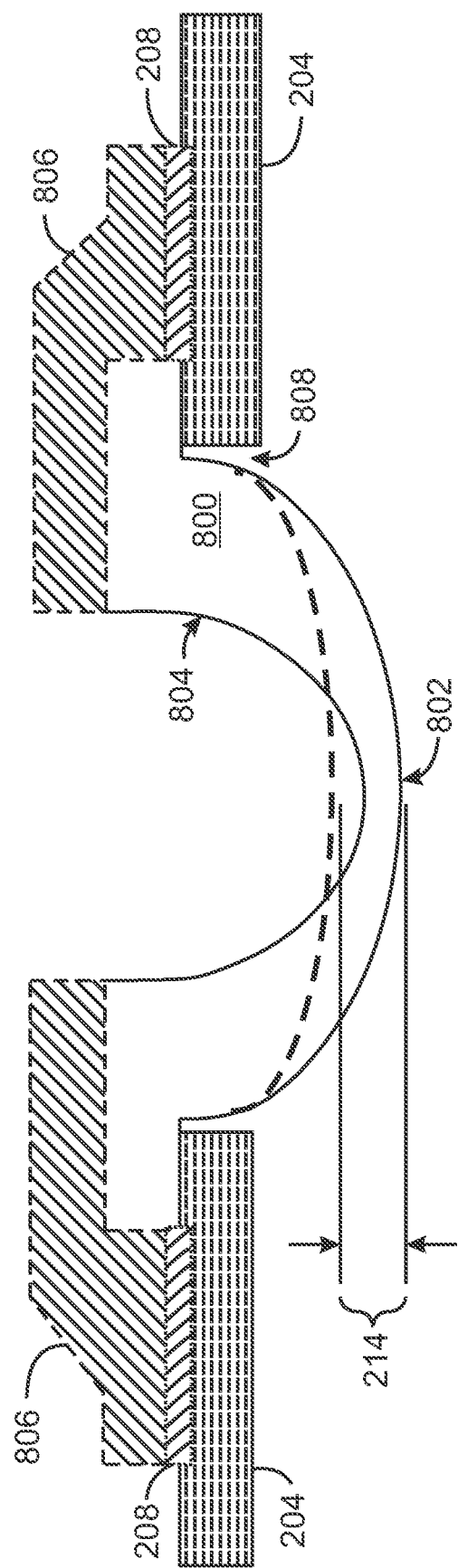
FIG. 8 is a cross-sectional view of another example of a floating rubber foot formed from a hollow structure having an uneven cross-section.
Figure 9:
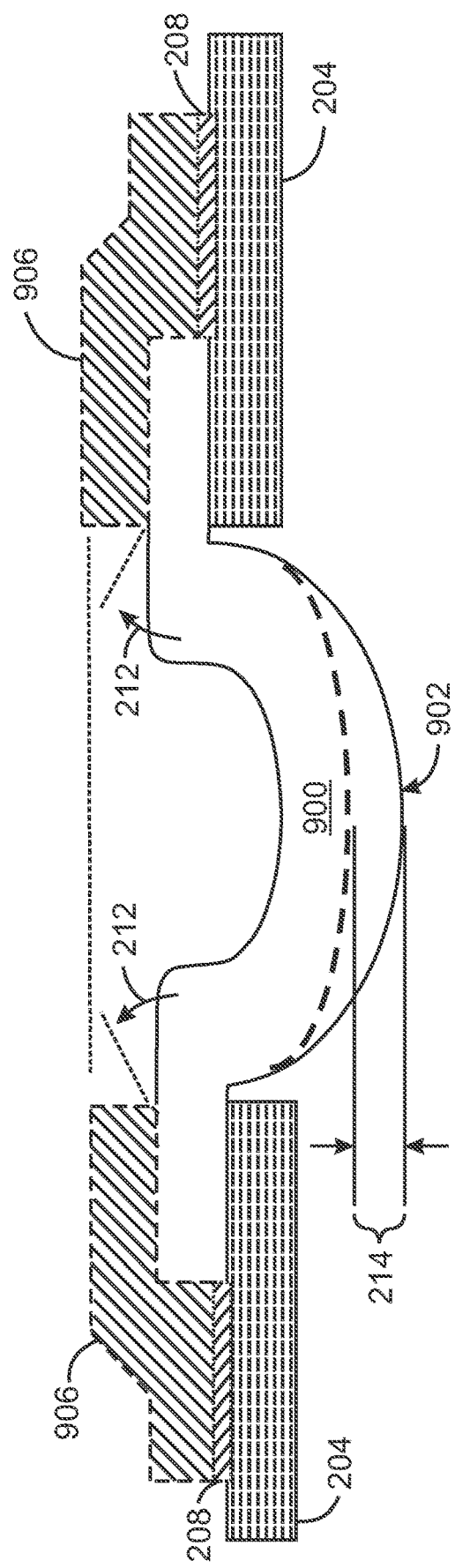
FIG. 9 is a cross-sectional view of another example of a floating rubber foot formed from a hollow structure having an uneven cross-section.

The plastic mounting device 402, and other plastic parts described with respect to FIGS. 8 and 9, may be formed from any number of thermoplastic polymers. These may include, for example, polyacrylates, high-impact polystyrene, polycarbonates, polyphenylene sulfides, or polyethylene terephthalates, among others.

The floating rubber foot 400 may be glued to the plastic part 402 prior to being mounted on the inside of the case 204 using the adhesive layer 208. In some examples, the floating rubber foot 400 may be positioned in the opening 202 in the case 204, and then the plastic part 402 may be positioned over the floating rubber foot 400 and mounted using the adhesive layer 208.

Figure 5:
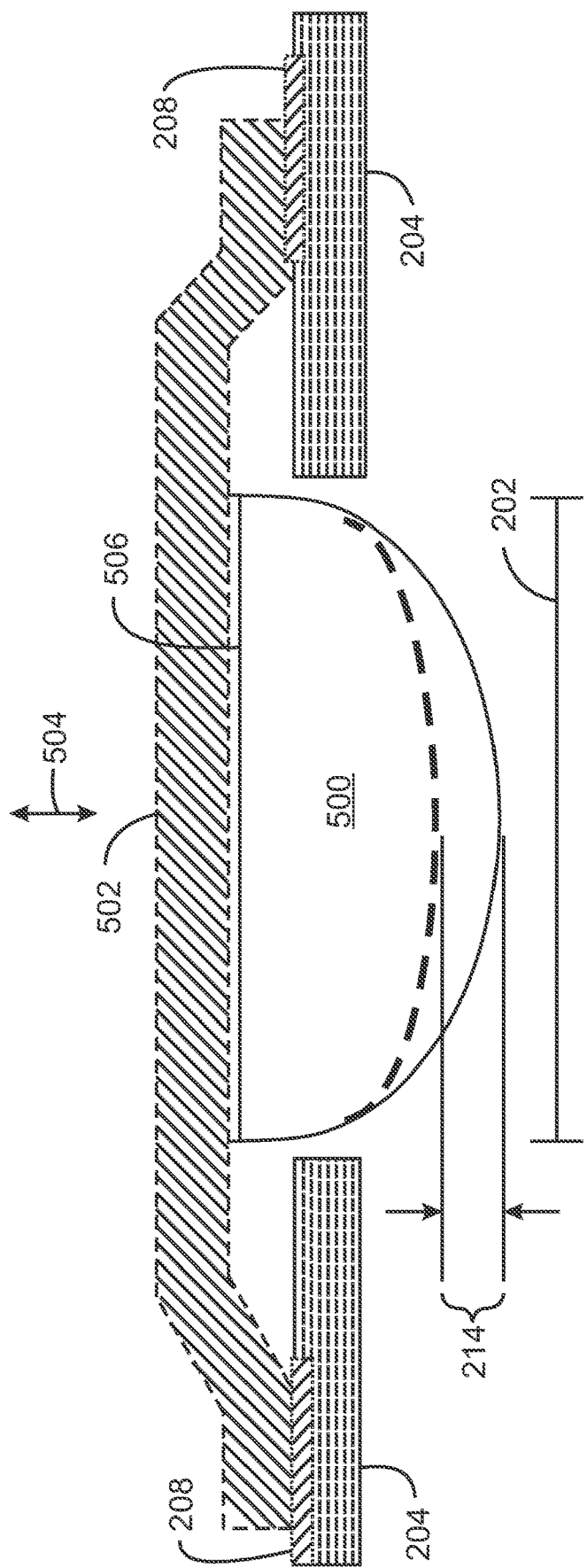
FIG. 5 is a cross-sectional view of an example of a floating rubber foot having a spring plate for mounting.

FIG. 5 is a cross-sectional view of an example of a floating rubber foot 500 having a spring plate 502 for mounting. Like numbered items are as described with respect to FIG. 2. In this example, the spring plate 502 is mounted to the inside of the case 204 by the adhesive layer 208. The floating rubber foot 500 is mounted to the spring plate 502 and protrudes through the opening 202 in the case 204. The motion 214 of the floating rubber foot 500 may include both compression of the floating rubber foot 500 itself, as well as a spring motion 504 from the spring plate 502.

The floating rubber foot 500 may be mounted to the spring plate 502 by a layer of adhesive 506. In some examples the floating rubber foot 500 may be joined to the spring plate 502 by partially melting the floating rubber foot 500 to the spring plate 502. In other examples, the floating rubber foot 500 may be joined to the spring plate 502 during manufacturing, for example, by being injection molded in contact with the spring plate 502.

Figure 6:
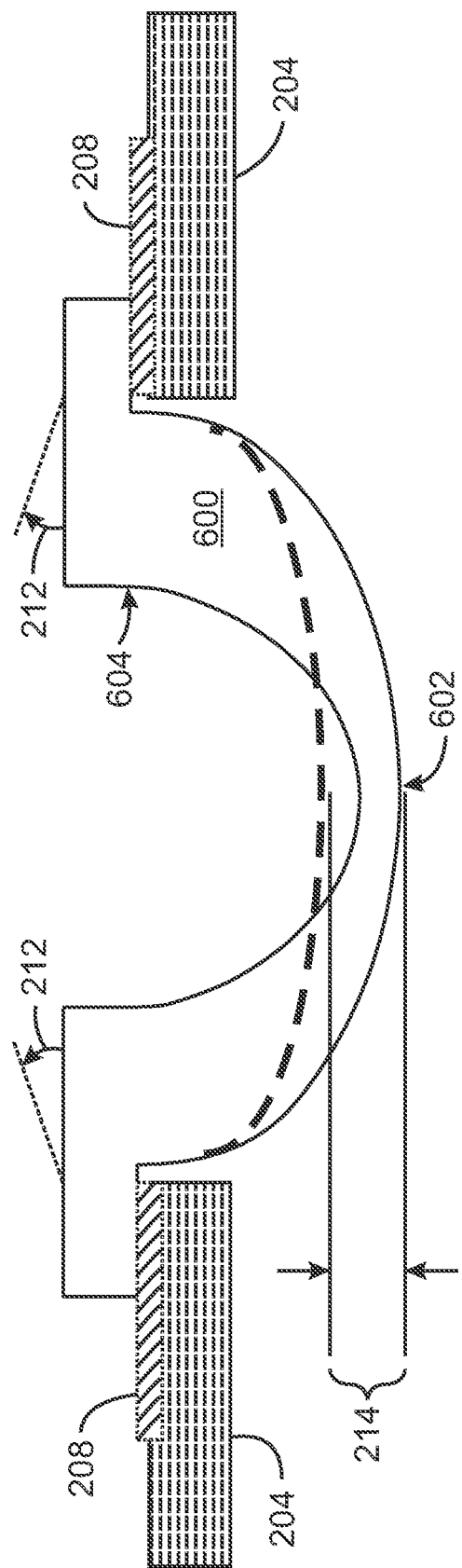
FIG. 6 is a cross-sectional view of an example of a floating rubber foot formed with a hollow structure having an uneven cross-section.

FIG. 6 is a cross-sectional view of an example of a floating rubber foot 600 formed with a hollow structure having an uneven cross-section. Like numbered items are as described with respect to FIG. 2. In this example, the floating rubber foot 600 is thinner at the point of contact 602 with a supporting surface and thicker near the edge 604. This may allow for control of the stiffness of the floating rubber foot 600 by allowing more motion 214 at the point of contact 602, while decreasing the amount of upwards motion 212 into the case 204.

Figure 7:
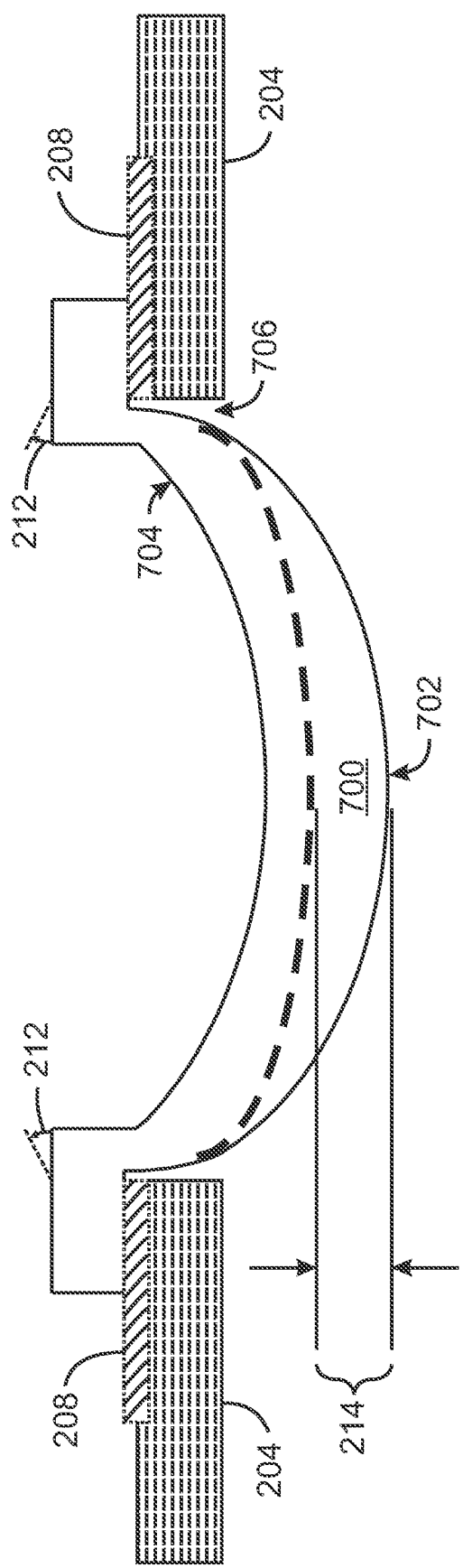
FIG. 7 is a cross-sectional view of another example of a floating rubber foot formed from a hollow structure having an uneven cross-section.

FIG. 7 is a cross-sectional view of another example of a floating rubber foot 700 formed from a hollow structure having an uneven cross-section. Like numbered items are as described with respect to FIG. 2. In this example, the floating rubber foot 700 is thicker at the point of contact 702 with a supporting surface and thinner near the edge 704. In this example, the upwards motion 212 may be lessened by the expansion of the floating rubber foot 700 in the vicinity of the edge 704 as pressure is placed on the floating rubber foot 700. The gap 706 between the floating rubber foot 700 and the case 204 may be adjusted to control the amount of expansion.

FIG. 8 is a cross-sectional view of another example of a floating rubber foot 800 formed from a hollow structure having an uneven cross-section. Like numbered items are as described with respect to FIG. 2. In some examples, the amount of room inside the case 204 above the floating rubber foot 800 may be limited. The profile of the thickness of the floating rubber foot 800 may be used to provide the motion 214 used to prevent rocking or contact with the support surface, while not allowing the floating rubber foot 800 to move up into the case.

In this example, the floating rubber foot 800 is thinner at the point of contact 802 and thicker near the edge 804. A plastic mounting peace 806 overlaps the upper portion of the floating rubber foot 800, blocking upward motion of the floating rubber foot 800. As a result, the motion 214 may result from the floating rubber foot 800 deforming near the point of contact 802. A gap 808 may be provided between the floating rubber foot 800 and the edge of the case 204, for example, to allow some expansion of the floating rubber foot 800 as it deforms.

FIG. 9 is a cross-sectional view of another example of a floating rubber foot 900 formed from a hollow structure having an uneven cross-section. Like numbered items are as described with respect to FIG. 2. In this example, the floating rubber foot 900 is held in place by a plastic mounting device 902. The plastic mounting device 902 allows some upwards motion 212 into the case 204, but limits the total amount of upwards motion 212. The floating rubber foot 900 may also deform at the point of contact 904, which, in combination with the upwards motion 212, may provide a selected amount of motion 214 when pressure is applied.

The selection of the appropriate structure for the floating rubber feet described with respect to FIGS. 2 through 9 may be made based on the weight of an electronic device, manufacturing variations in the formation of the case 204 of the electronic device, and anticipated motions caused by use, such as key presses. Further, for a specific electronic device, the structure of the floating rubber feet may be adjusted to tune the amount of motion 212 and minimize rocking motions or contact with a supporting surface.

Figure 10:
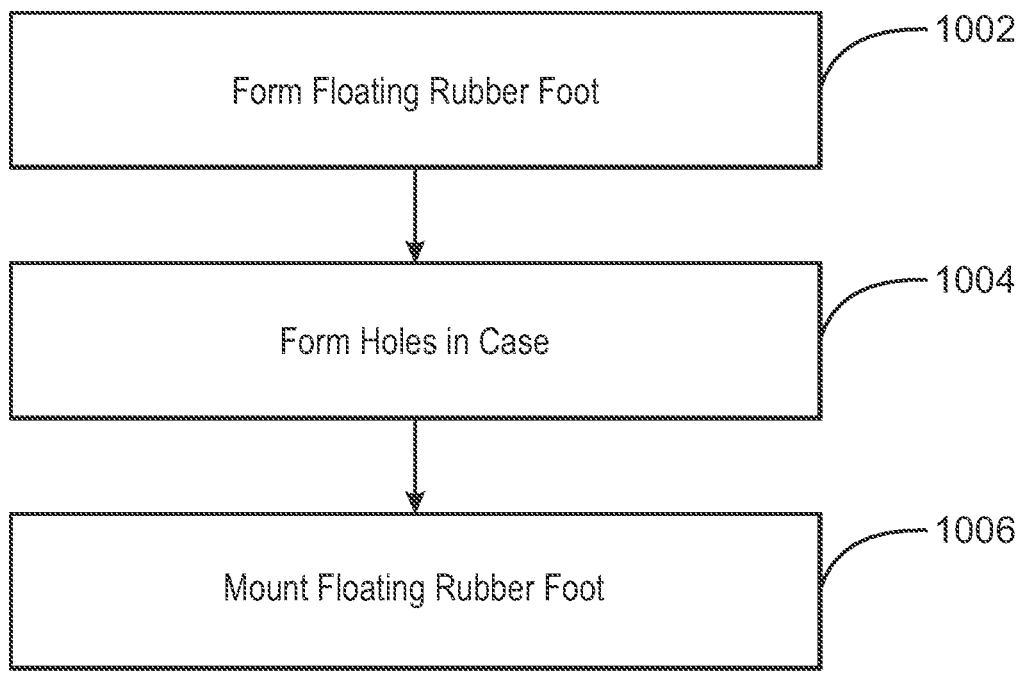
FIG. 10 is a process flow diagram of an example of a method for creating a floating rubber foot for an electronic device.

FIG. 10 is a process flow diagram of an example of a method 1000 for creating a floating rubber foot for an electronic device. The method 1000 begins at block 1002 with the formation of the floating rubber foot. As described herein, the floating rubber foot may be formed from silicone rubber or any number of other elastomeric polymers. The formation of the floating rubber foot may be performed by injection molding, or by other techniques known in the art, such as thermoforming. In some examples, such as when a plastic mounting devices used, double injection molding techniques may be used to form the plastic mounting device followed by injection molding the floating rubber foot in contact with the plastic mounting device. Once the floating rubber foot is formed, the polymers forming the floating rubber foot may be cross-linked if desired.

At block 1004, holes are formed in the bottom of the case for the electronic device. The holes that are formed are selected in size by the size of the floating rubber foot, for example, to leave a gap between the edge of the floating rubber foot and the edge of the bottom of the case as the floating rubber foot protrude through the holes from the interior of the electronic device.

At block 1006, the floating rubber foot is mounted on the inside of the case of the electronic device to protrude through the opening at the bottom of the case. The mounting may be performed by applying a layer of adhesive around the opening on the inside of the bottom of the case, and then placing the floating rubber foot onto the adhesive where the floating rubber foot protrudes through the opening.

As described herein, in some examples, a plastic mounting device is used along with the floating rubber foot. In these examples, the floating rubber foot may be set or mounted in place, and the plastic mounting device placed over the floating rubber foot in contact with a layer of adhesive on the floating rubber foot or on the case around the floating rubber foot. In examples in which the floating rubber foot and the plastic mounting device are formed together, such as through double injection molding, the plastic mounting device may hold the floating rubber foot in position. In these examples, the plastic mounting device may be mounted to the layer of adhesive around the opening.

Figure 11:
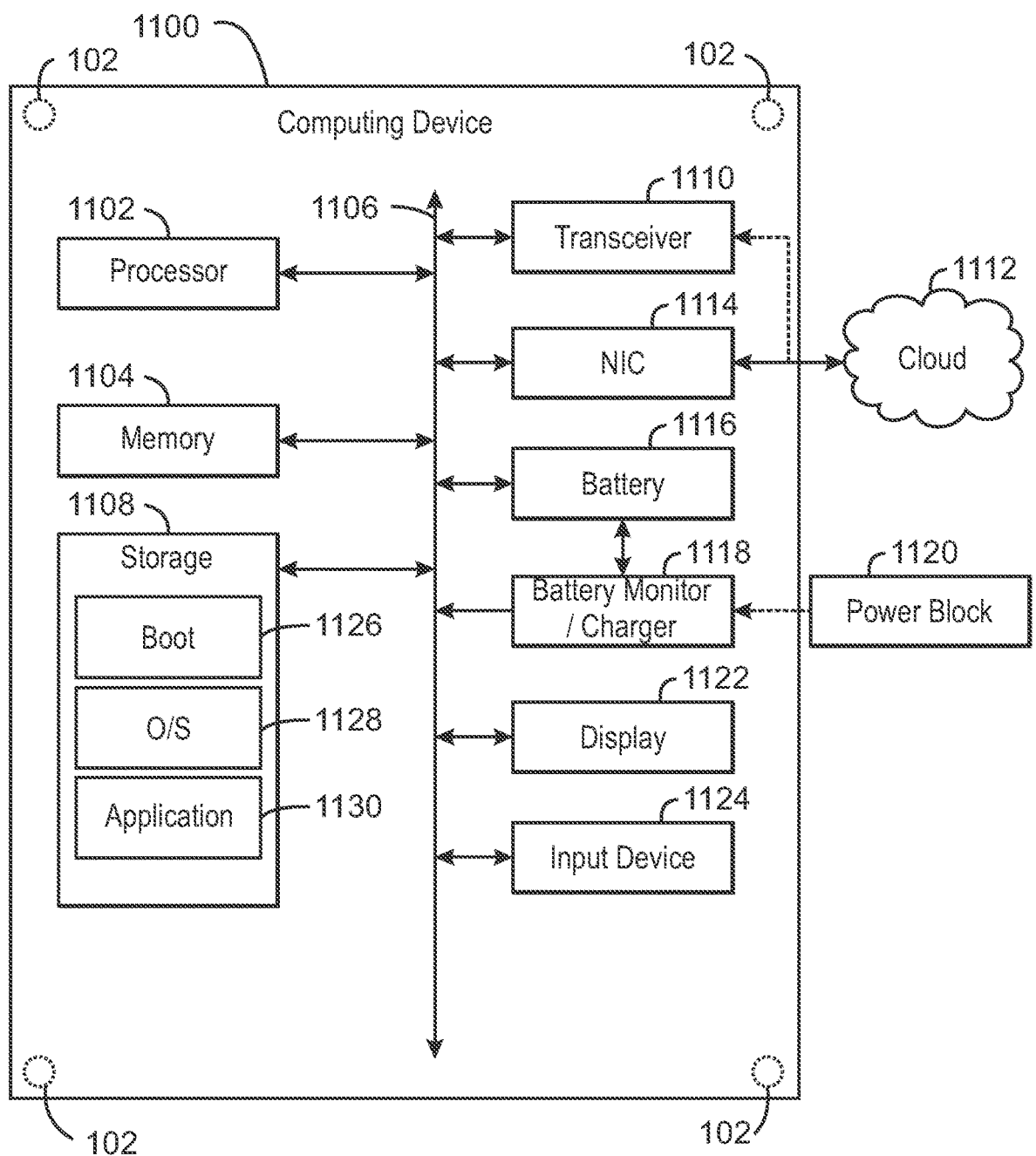
FIG. 11 is a block diagram of an example of components that may be present in a computing device that uses floating rubber feet.

FIG. 11 is a block diagram of an example of components that may be present in a computing device 1100 that uses floating rubber feet 102. The computing device 1100 may be a laptop computer, a tablet computer, a smart phone, or any number of other devices. The computing device 1100 may include a processor 1102, which may be a microprocessor, a single core processor, a multi-core processor, a multi-threaded processor, an ultra-low voltage processor, an embedded processor, or any other type of processors. The processor 1102 may be a part of a system-on-a-chip in which the processor 1102 and other components are formed into a single integrated circuit or on a single circuit board.

The processor 1102 may communicate with a system memory 1104 over a bus 1106. Any number of memory devices may be used to provide for a given amount of system memory, including random access memory (RAM), static random access memory (SRAM), dynamic RAM, and the like.

A mass storage 1108 may also be coupled to the processor 1102 via the bus 1106. The mass storage 1108 may be included to provide for persistent storage of information and data. The mass storage 1108 may be implemented via a solid-state drive (SSD). Other devices that may be used for the mass storage 1108 include read only memory (ROM), flash memory, micro hard drives, hard drives, and the like.

The components may communicate over the bus 1106. The bus 1106 may include any number of technologies, including industry standard architecture (ISA), extended ISA (EISA), peripheral component interconnect (PCI), peripheral component interconnect extended (PCIx), PCI express (PCIe), or any number of other technologies. The bus 1106 may be a proprietary bus, for example, used in a SoC based system, such as in a smart phone, tablet computer, and the like. Other bus systems may be included, such as point-to-point interfaces and a power bus, among others.

The bus 1106 may couple the processor 1102 to a transceiver 1110, for communications with a cloud 1112, such as a local network, a wide area network or the Internet. The transceiver 1110 may use any number of frequencies and protocols, such as 2.4 gigahertz (GHz) transmissions under the IEEE 802.15.4 standard, using the Bluetooth® low energy (BLE) standard, as defined by the Bluetooth® Special Interest Group. The transceiver 1110 may include a WLAN unit that may be used to implement Wi-Fi™ communications in accordance with the Institute of Electrical and Electronics Engineers (IEEE) 802.11 standard. In addition, wireless wide area communications, for example, according to a cellular or other wireless wide area protocol, can occur via a WWAN unit.

A network interface controller (NIC) 1114 may be included to provide a wired communication link to the cloud 1112. The wired communication link may provide an Ethernet protocol connection, or may provide a wired communication link that is based on other types of network and interface protocols.

A battery 1116 may power the computing device 1000, although the computing device 1000 may use a power supply that is directly coupled to an electric power grid. The battery 1116 may be a lithium ion battery, a metal-air battery, or nickel cadmium battery, among others. A battery monitor/charger 1118 may be included in the computing device 1100 to charge the battery 1116, monitor the charging of the battery 1116, and monitor the status of the charge on the battery 1116.

A power block 1120 may be coupled with the battery monitor/charger 1118 to charge the battery 1116. In some examples, the power block 1120 may be replaced with a wireless power receiver to provide the power wirelessly, for example, through a loop antenna in the computing device 1100.

The bus 1106 may couple the processor 1102 to a display device 1122. The display device 1122 may be built into the computing device 1100, such as a display on a laptop computer, tablet computer, or smart phone. In other examples, the display device 1122 may be an external device coupled to the computing device 1100 through an interface.

An input device 1124 may be coupled to the processor 1102 through the bus 1106. The input device 1124 may be a touchscreen panel associated with the display device 1122, a keyboard built into the computing device 1100, a touchpad built into the computing device 1100, an external pointing device, such as a mouse, connected to the computing device 1100, or any combinations thereof.

The mass storage 1108 may include code modules to implement functionality. A booting module 1126 may include start up code to boot the processor 1102. An operating system 1128 may be included to provide an interface between the user and the computing device 1100, and to provide basic operations within the computing device 1100. Applications 1130 may be included to provide functionality, such as communication applications, word processing applications, and the like.

While the present techniques may be susceptible to various modifications and alternative forms, the examples discussed above have been shown only by way of example. It is to be understood that the technique is not intended to be limited to the particular examples disclosed herein. Indeed, the present techniques include all alternatives, modifications, and equivalents falling within the scope of the present techniques.

What is claimed is:

1. A floating rubber foot structure, comprising a floating rubber foot extending through an opening in a device case, wherein the floating rubber foot is mounted by a pillar to an inner surface of the device case at a mounting point proximate to the opening, and wherein the floating rubber foot is disposed with a void that extends from the inner surface to an exterior surface of the device case along the pillar and between the floating rubber foot and the device case such that the rubber foot is suspended through the opening from the pillar at the mounting point.

2. The floating rubber foot structure of claim 1, wherein the void includes no intervening material between the floating rubber foot and the wall of the opening of the device to allow the rubber foot to deform within the device case.

3. The floating rubber foot structure of claim 1, wherein the floating rubber foot comprises a hollow structure of even thickness that is suspended within the device case from the mounting point on the inner surface of the device case around the opening.

4. The floating rubber foot structure of claim 1, wherein the floating rubber foot comprises a hollow structure of even thickness that is mounted within the device case by a plastic ring disposed on the inner surface of the device case around the opening.

5. The floating rubber foot structure of claim 1, wherein the floating rubber foot comprises a solid hemispherical structure that is suspended within the device case from the mounting point on the inner surface of the device case around the opening.

6. The floating rubber foot structure of claim 1, wherein the floating rubber foot comprises a solid hemispherical structure that is mounted within the device case by a plastic ring disposed on the inner surface of the device case around the opening.

7. A floating rubber foot structure, comprising a floating rubber foot suspended from a flexible metal structure mounted on an inner surface of a device case around an opening, wherein the floating rubber foot is disposed with a void that extends from the inner surface to an exterior surface of the device case between the floating rubber foot and a wall of the opening in the device case.

8. The floating rubber foot structure of claim 7, wherein the floating rubber foot comprises a hollow hemispherical structure that is suspended within the device case from the mounting point on the inner surface of the device case around the opening, and wherein the hollow hemispheric structure is thicker around proximate to the opening in the device case, and thinner at a center of the structure.

9. The floating rubber foot structure of claim 7, wherein the floating rubber foot comprises a hollow hemispherical structure that is suspended within the device case from the mounting point on the inner surface of the device case around the opening, and wherein the hollow hemispheric structure is proximate to the opening in the device case, and thicker at a center of the structure.

10. The floating rubber foot structure of claim 7, wherein the floating rubber foot comprises a hollow hemispherical structure that is suspended within the device case from the mounting point on the inner surface of the device case around the opening, and wherein the hollow hemispheric structure is thinner proximate to the opening in the device case, and thicker at a center of the structure and wherein the hollow hemispheric structure is mounted within the device case by a plastic ring disposed on the inner surface of the device case around the opening.

11. A method for forming a floating rubber foot structure, comprising:
    forming a floating rubber foot;
    forming a hole in a case; and
    mounting the floating rubber foot with a pillar at a mounting point at an inner surface of the case proximate to the hole in the case by a plastic ring disposed on the inner surface of the case around the hole, wherein a center portion of the floating rubber foot protrudes through the hole in the case, and wherein the center portion of the floating rubber foot has a void along the pillar and between the center portion and the walls of the hole in the case such that the rubber foot is suspended through the hole in the case from the pillar at the mounting point.

12. The method of claim 11, wherein forming the floating rubber foot comprises injection molding the floating rubber foot.

13. The method of claim 11, wherein forming the floating rubber foot comprises thermoforming the floating rubber foot.

14. The method of claim 11, wherein forming the floating rubber foot comprises a double injection molding process, comprising:
    injection molding the floating rubber foot; and
    injection molding a plastic mounting device around the floating rubber foot.

15. The method of claim 14, wherein mounting the floating rubber foot comprises mounting the plastic mounting device to the inner surface of the case proximate to the hole in the case.

* * * * *